US008833422B2

(12) United States Patent
Yamashita

(10) Patent No.: US 8,833,422 B2
(45) Date of Patent: Sep. 16, 2014

(54) METHOD FOR FABRICATING A SEMICONDUCTOR DEVICE AND SEMICONDUCTOR PRODUCTION APPARATUS

(71) Applicant: Kabushiki Kaisha Toshiba, Tokyo (JP)

(72) Inventor: Daisuke Yamashita, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/780,337

(22) Filed: Feb. 28, 2013

(65) Prior Publication Data

US 2013/0240127 A1    Sep. 19, 2013

(30) Foreign Application Priority Data

Mar. 14, 2012    (JP) ................................. 2012-057279

(51) Int. Cl.
| B32B 38/10 | (2006.01) |
| B32B 43/00 | (2006.01) |
| H01L 21/48 | (2006.01) |

(52) U.S. Cl.
CPC ..................................... H01L 21/48 (2013.01)
USPC ......................................... 156/758; 156/766

(58) Field of Classification Search
CPC ................... H01L 21/67092; H01L 21/67132; H01L 21/6835; H01L 21/6836; H01L 21/6838; B32B 7/06; B32B 37/1018; B32B 38/004; B32B 38/185; B32B 2309/68; B65H 35/0026
USPC ......... 156/247, 250, 269, 270, 701, 707, 714, 156/716, 382, 510, 576, 750, 758, 764–766
See application file for complete search history.

(56) References Cited

U.S. PATENT DOCUMENTS

| 6,824,643 B2 * | 11/2004 | Yoshimoto et al. ........... 156/765 |
| 6,949,158 B2 * | 9/2005 | Ball et al. ...................... 156/154 |
| 6,951,593 B2 * | 10/2005 | Yamaguchi ................... 156/230 |
| 7,183,178 B2 * | 2/2007 | Arai .............................. 438/459 |
| 7,348,216 B2 * | 3/2008 | Codding et al. .............. 438/108 |
| 7,452,752 B2 * | 11/2008 | Noda et al. .................... 438/114 |
| 7,482,249 B2 * | 1/2009 | Jakob et al. ................... 438/460 |

(Continued)

FOREIGN PATENT DOCUMENTS

| JP | 2009-141314 A | 6/2009 |
| JP | 2009-239107 A | 10/2009 |
| JP | 2010-219467 A | 9/2010 |
| WO | WO 2009091333 A2 * | 7/2009 |

OTHER PUBLICATIONS

Japanese Office Action dated Apr. 30, 2014 in counterpart Japanese Application No. 2012-057279.

*Primary Examiner* — Sing P Chan

(74) *Attorney, Agent, or Firm* — Holtz, Holtz, Goodman & Chick PC

(57) ABSTRACT

A semiconductor production apparatus includes a supporting substrate having an upper surface to which a semiconductor substrate is bonded and a lower surface to which a back side grinding (BSG) tape is bonded, a stage having an upper surface on which a peeling tape is positioned such that an adhesive surface of the peeling tape is oriented upwards, and a handler which transfers the supporting substrate to the stage in a state such that the BSG tape bonded to the lower surface of the supporting substrate is oriented downwards toward the stage and positioned onto the peeling tape. A peeling unit draws the peeling tape to peel the BSG tape from the lower surface of the supporting substrate.

8 Claims, 18 Drawing Sheets

(56) References Cited

U.S. PATENT DOCUMENTS

| | | | | |
|---|---|---|---|---|
| 7,498,239 B2* | 3/2009 | Arai | | 438/464 |
| 7,520,309 B2* | 4/2009 | Priewasser | | 156/382 |
| 7,534,498 B2* | 5/2009 | Noda et al. | | 428/446 |
| 7,594,977 B2* | 9/2009 | Saito et al. | | 156/286 |
| 7,621,307 B2* | 11/2009 | Saito et al. | | 156/382 |
| 7,759,050 B2* | 7/2010 | Kessel et al. | | 430/319 |
| 7,964,449 B2* | 6/2011 | Haji et al. | | 438/113 |
| 7,988,807 B2* | 8/2011 | Noda et al. | | 156/272.2 |
| 8,038,839 B2* | 10/2011 | Noda et al. | | 156/712 |
| 8,039,276 B2* | 10/2011 | Amada et al. | | 438/17 |
| 8,153,452 B2* | 4/2012 | Amada et al. | | 438/17 |
| 8,181,688 B2* | 5/2012 | Johnson et al. | | 156/752 |
| 8,267,143 B2* | 9/2012 | George et al. | | 156/758 |
| 8,336,595 B2* | 12/2012 | Saito et al. | | 156/382 |
| 8,366,873 B2* | 2/2013 | George | | 156/707 |
| 8,492,176 B2* | 7/2013 | Amada | | 438/15 |
| 8,546,244 B2* | 10/2013 | Abe et al. | | 438/458 |
| 8,551,291 B2* | 10/2013 | George | | 156/706 |
| 2001/0024936 A1* | 9/2001 | Ishikawa et al. | | 451/67 |
| 2001/0029064 A1* | 10/2001 | Odajima et al. | | 438/113 |
| 2001/0029088 A1* | 10/2001 | Odajima et al. | | 438/464 |
| 2002/0166625 A1* | 11/2002 | Ball et al. | | 156/247 |
| 2003/0075271 A1* | 4/2003 | Yoshimoto et al. | | 156/344 |
| 2003/0079828 A1* | 5/2003 | Kassir et al. | | 156/230 |
| 2003/0102682 A1* | 6/2003 | Kurokawa | | 294/64.1 |
| 2003/0134578 A1* | 7/2003 | Strasbaugh et al. | | 451/41 |
| 2003/0140486 A1* | 7/2003 | Chen et al. | | 29/825 |
| 2003/0162322 A1* | 8/2003 | Chen et al. | | 438/106 |
| 2003/0173035 A1* | 9/2003 | Yamaguchi | | 156/580 |
| 2004/0016401 A1* | 1/2004 | Ignatiev et al. | | 118/718 |
| 2004/0020430 A1* | 2/2004 | Ignatiev et al. | | 118/718 |
| 2005/0098887 A1* | 5/2005 | Ball et al. | | 257/738 |
| 2005/0101082 A1* | 5/2005 | Yokoyama et al. | | 438/232 |
| 2005/0106840 A1* | 5/2005 | Arai | | 438/459 |
| 2005/0233499 A1* | 10/2005 | Okuda et al. | | 438/118 |
| 2005/0233547 A1* | 10/2005 | Noda et al. | | 438/459 |
| 2005/0274457 A1* | 12/2005 | Cheung et al. | | 156/344 |
| 2007/0026640 A1* | 2/2007 | Priewasser | | 438/460 |
| 2007/0077685 A1* | 4/2007 | Noda et al. | | 438/107 |
| 2007/0077752 A1* | 4/2007 | Codding et al. | | 438/623 |
| 2007/0123002 A1* | 5/2007 | Norimoto et al. | | 438/464 |
| 2007/0190318 A1* | 8/2007 | Asai et al. | | 428/343 |
| 2008/0014532 A1* | 1/2008 | Kessel et al. | | 430/311 |
| 2008/0099149 A1* | 5/2008 | Codding et al. | | 156/382 |
| 2008/0105971 A1* | 5/2008 | Okuda et al. | | 257/737 |
| 2008/0210371 A1* | 9/2008 | Saito et al. | | 156/285 |
| 2009/0017248 A1* | 1/2009 | Larson et al. | | 428/41.5 |
| 2009/0017323 A1* | 1/2009 | Webb et al. | | 428/521 |
| 2009/0115075 A1* | 5/2009 | Kessel et al. | | 257/787 |
| 2009/0133812 A1* | 5/2009 | Noda et al. | | 156/153 |
| 2009/0176349 A1* | 7/2009 | Jakob et al. | | 438/465 |
| 2009/0209087 A1* | 8/2009 | Arita | | 438/462 |
| 2009/0242124 A1* | 10/2009 | Konno et al. | | 156/344 |
| 2010/0038035 A1* | 2/2010 | Noda et al. | | 156/379.6 |
| 2010/0041211 A1* | 2/2010 | Noda et al. | | 438/464 |
| 2010/0084096 A1* | 4/2010 | Saito et al. | | 156/378 |
| 2010/0127306 A1* | 5/2010 | Okuda et al. | | 257/139 |
| 2010/0263794 A1* | 10/2010 | George et al. | | 156/344 |
| 2010/0266373 A1* | 10/2010 | George et al. | | 414/225.01 |
| 2010/0267175 A1* | 10/2010 | Amada et al. | | 438/17 |
| 2010/0279491 A1* | 11/2010 | Kiuchi et al. | | 438/464 |
| 2011/0212609 A1* | 9/2011 | Okuda et al. | | 438/514 |
| 2011/0253314 A1* | 10/2011 | George | | 156/706 |
| 2011/0253315 A1* | 10/2011 | George | | 156/718 |
| 2011/0297771 A1* | 12/2011 | Noda et al. | | 241/65 |
| 2012/0184068 A1* | 7/2012 | Abe et al. | | 438/107 |
| 2012/0312468 A1* | 12/2012 | Taga et al. | | 156/285 |
| 2012/0312482 A1* | 12/2012 | Konno et al. | | 156/758 |
| 2013/0084459 A1* | 4/2013 | Larson et al. | | 428/422 |
| 2013/0089970 A1* | 4/2013 | Amada | | 438/465 |

* cited by examiner

METHOD FOR FABRICATING A SEMICONDUCTOR DEVICE AND SEMICONDUCTOR PRODUCTION APPARATUS

CROSS REFERENCE TO RELATED APPLICATION

This application is based upon and claims the benefit of priority from prior Japanese Patent Application No. 2012-057279, filed on Mar. 14, 2012, the entire contents of which are incorporated herein by reference.

FIELD

Embodiments of the invention relate to a method for production a semiconductor device and to a semiconductor production apparatus.

BACKGROUND

When a vertical-type semiconductor device is formed on a semiconductor substrate (hereinafter, referred to as wafer), a thickness of the wafer is reduced by grinding and polishing, for example, a back surface of the wafer. After that, the back surface of the wafer having a reduced thickness is subjected to various types of processing such as formation of electrodes on the back surface.

In the process of reducing the thickness of the wafer, a surface protection tape (hereinafter, referred to as back side grinding (BSG) tape) is bonded on a side of a main surface of the wafer before the thickness of the wafer is reduced by grinding and polishing, for example, the back surface of the wafer. The BSG tape needs to be peeled off after the thickness of the wafer is reduced.

Conventionally, the peeling of the BSG tape is performed in the following manner. A wafer is placed on an absorption stage such that a back surface of the wafer is oriented downwards. A peeling tape is pressure-bonded to a BSG tape bonded to a main surface of the wafer. The BSG tape and the peeling tape are removed together from the main surface of the wafer. Thus, the BSG tape is peeled off.

However, in the conventional peeling method, the wafer is placed on the absorption stage such that the back surface of the wafer is oriented downwards, and hence there may be that particles (dust) or contaminants (e.g., organic matters and metals) adhere to the back surface of the wafer, the wafer is damaged due to mechanical contact, and so on.

When particles adhere to the back surface of the wafer, there may be that electrodes on the back surface formed by sputtering are detached or defects occur during resist coating or light exposure in a photolithography process. Moreover, upon implantation of impurity ions in an ion implantation process, there may be that impurity ions are not implanted in some areas because such particles may function as an ion-shielding material (block material).

Further, when contaminants adhere to the wafer, there is a fear that a conductive type of a channel of a semiconductor device is reversed during a diffusion process (e.g., thermal diffusion and laser annealing) or the lifetime of carrier is below a standard value. Moreover, if the wafer is damaged due to mechanical contact, there is a fear that a break or crack occurs in the wafer and the back surface of the wafer cannot be subjected to processing.

DETAILED DESCRIPTION

Figure 1:
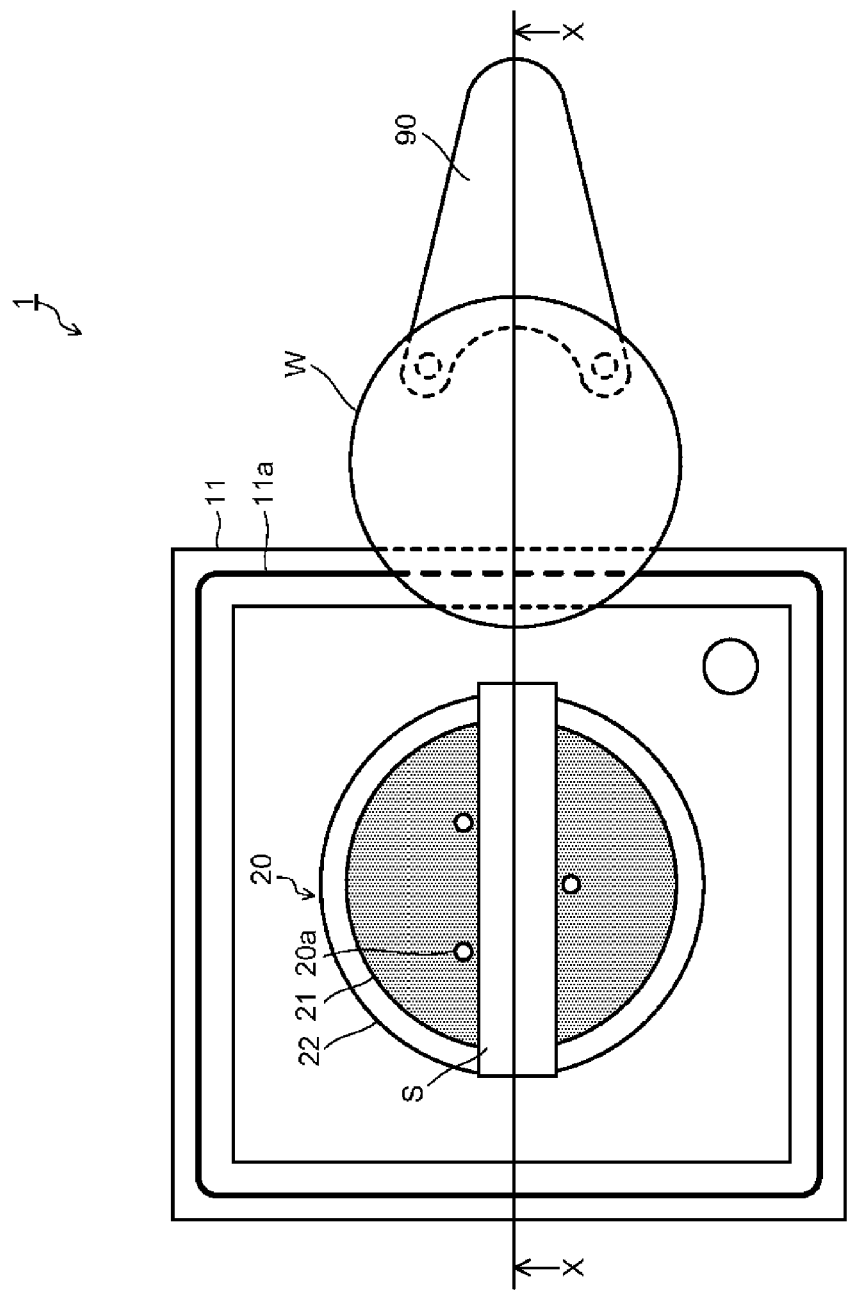
FIG. 1 is a plan view showing a configuration of a semiconductor production apparatus according to a first embodiment.

An aspect of the present embodiment, there is provided a method for fabricating a semiconductor device including placing a semiconductor substrate, onto which a BSG tape bonded via a supporting substrate, on a stage placed a peeling tape in a state that an adhesive surface of the peeling tape is oriented upwards and the BSG tape is oriented downwards to the stage, bonding the peeling tape onto the BSG tape in a state that the BSG tape is retained to be oriented downwards and placed on the adhesive surface of the peeling tape, drawing the peeling tape to a lower side of the stage to peel the peeling tape in a state that the peeling tape is retained to be bonded onto the BSG tape, and supporting the supporting substrate exposed from the BSG tape in the drawing of the peeling tape.

Another aspect of the present embodiment, there is provided a method for fabricating a semiconductor device including placing a semiconductor substrate, onto which a BSG tape is bonded, on a stage provided a peeling tape in a state that an adhesive surface of the peeling tape is oriented upwards and the BSG tape is oriented downwards to the stage, bonding the peeling tape onto the BSG tape, drawing the peeling tape to a lower side of the stage to peel the peeling tape in a state that the peeling tape is retained to be bonded onto the BSG tape, and supporting the semiconductor substrate protruded from the stage in the drawing of the peeling tape.

Another aspect of the present embodiment, there is provided a semiconductor production apparatus including a stage configured to be placed a peeling tape, an adhesive surface of the peeling tape being oriented to upwards;, a placing unit configured to place a semiconductor substrate, onto which a BSG tape is bonded, on the stage in a state that the BSG tape is oriented downwards to the stage, a peeling unit configured to draw the peeling tape to a lower side of the stage to peel the peeling tape in a state that the peeling tape is retained to be bonded on the BSG tape, a supporting unit configured to support the semiconductor substrate protruded from the stage in the drawing of the peeling tape.

Hereinafter, embodiments will be described in detail with reference to the drawings.

(First Embodiment)

Figure 2:
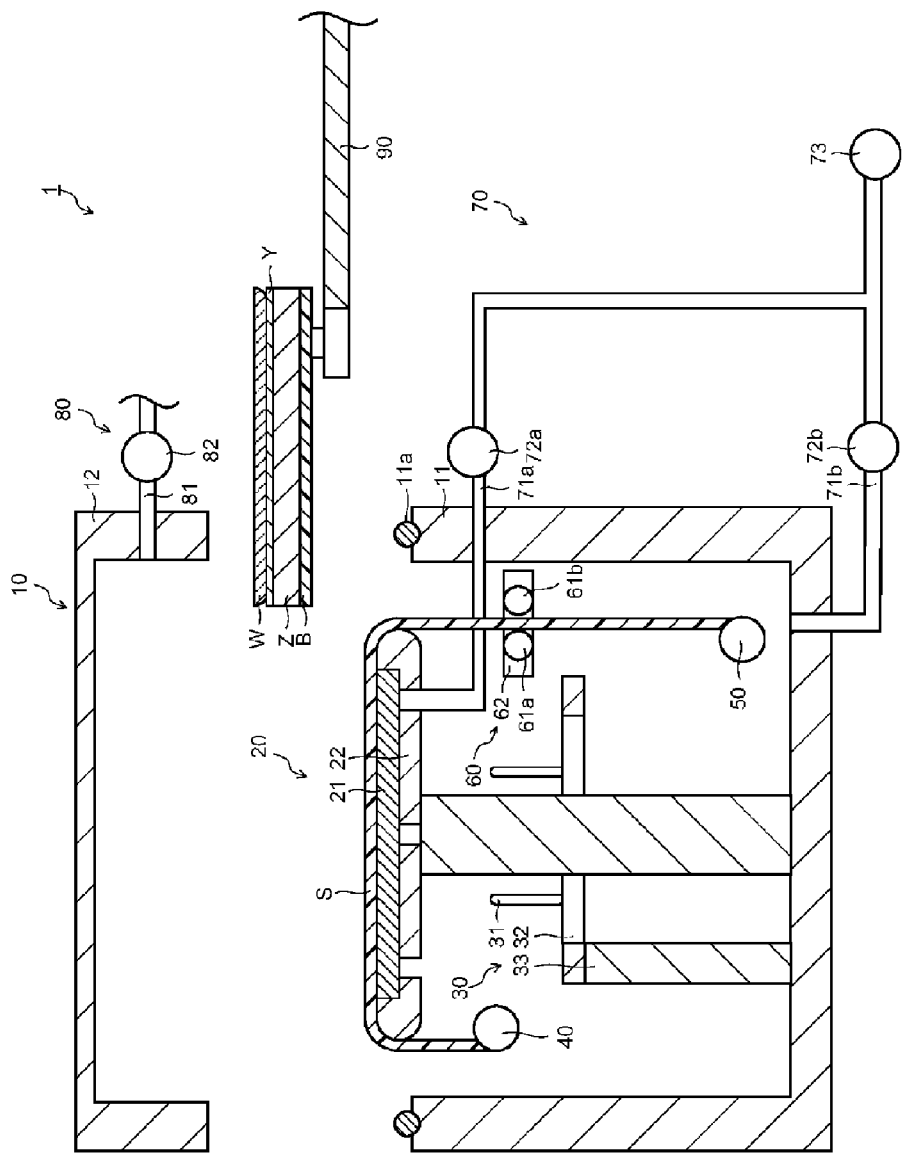
FIG. 2 is a cross-sectional view showing the configuration of the semiconductor production apparatus according to the first embodiment.
Figure 3:
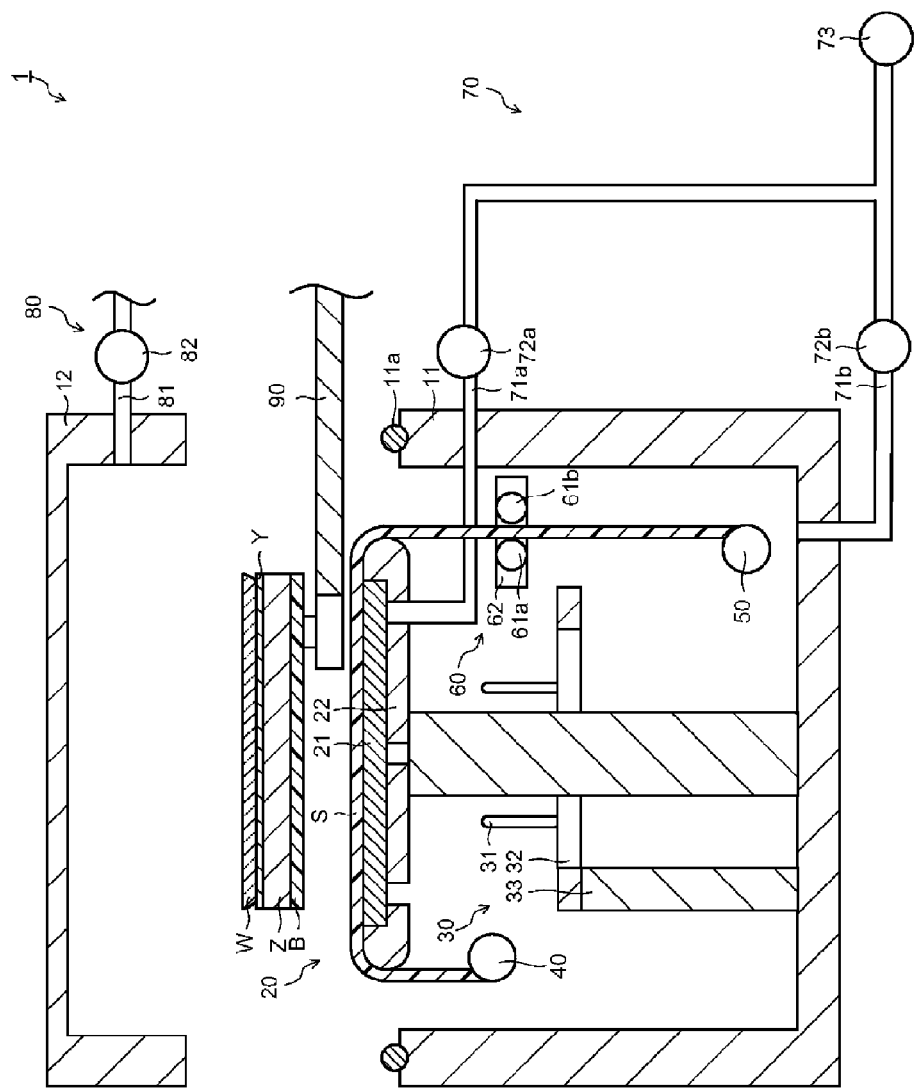
FIG. 3 is a cross-sectional view showing an operation of the semiconductor production apparatus according to the first embodiment.
Figure 4:
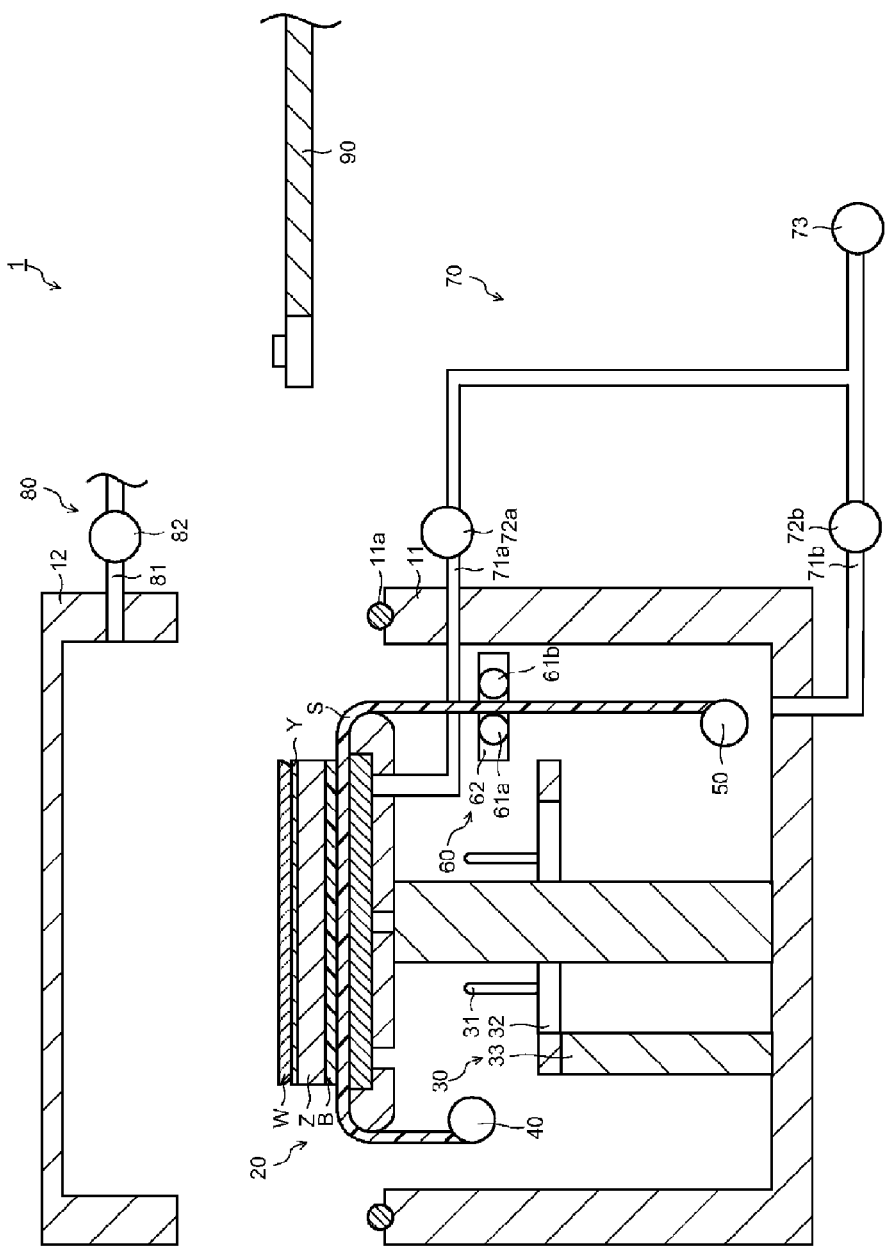
FIG. 4 is a cross-sectional view showing an operation of the semiconductor production apparatus according to the first embodiment.
Figure 5:
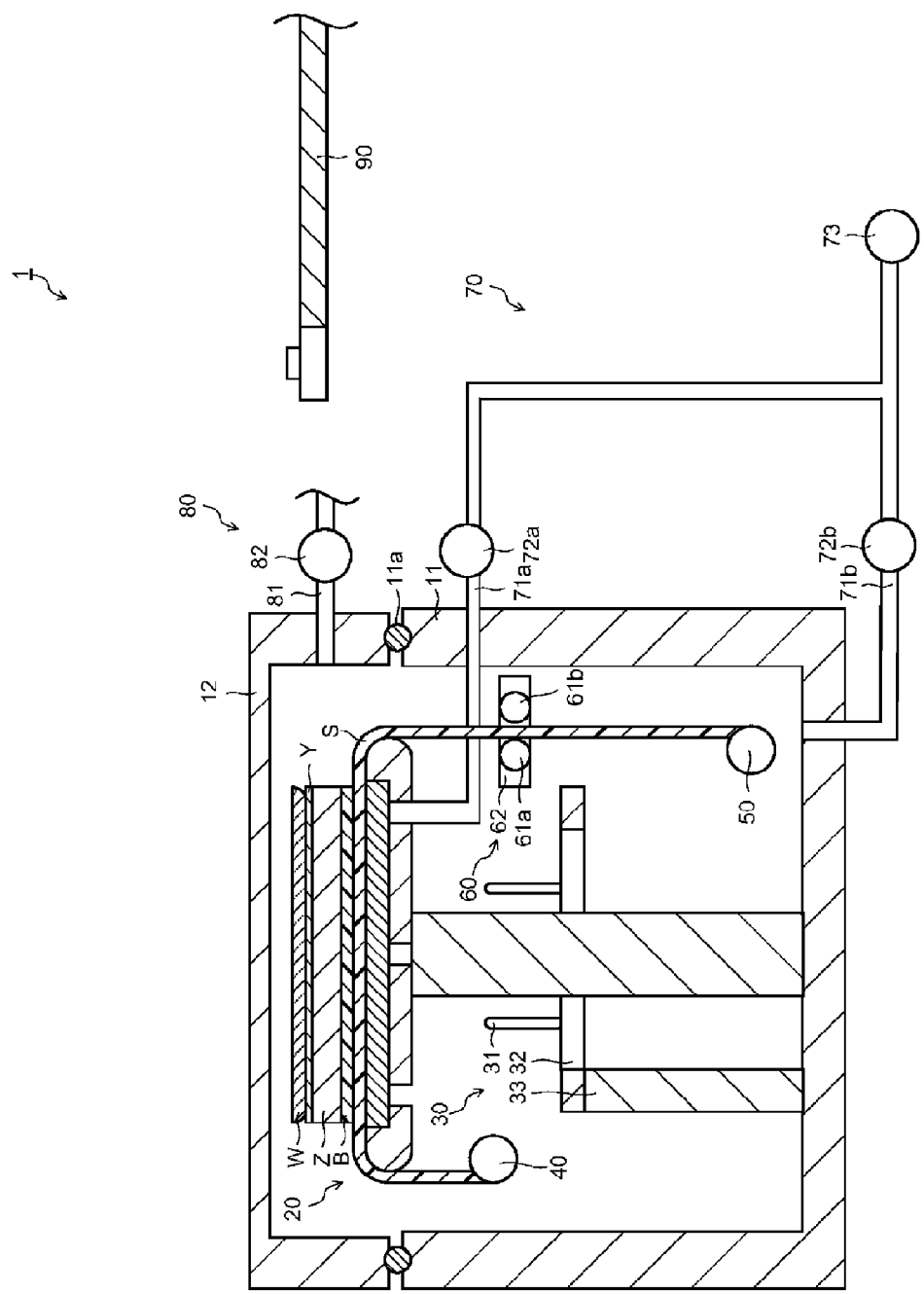
FIG. 5 is a cross-sectional view showing an operation of the semiconductor production apparatus according to the first embodiment.
Figure 6:
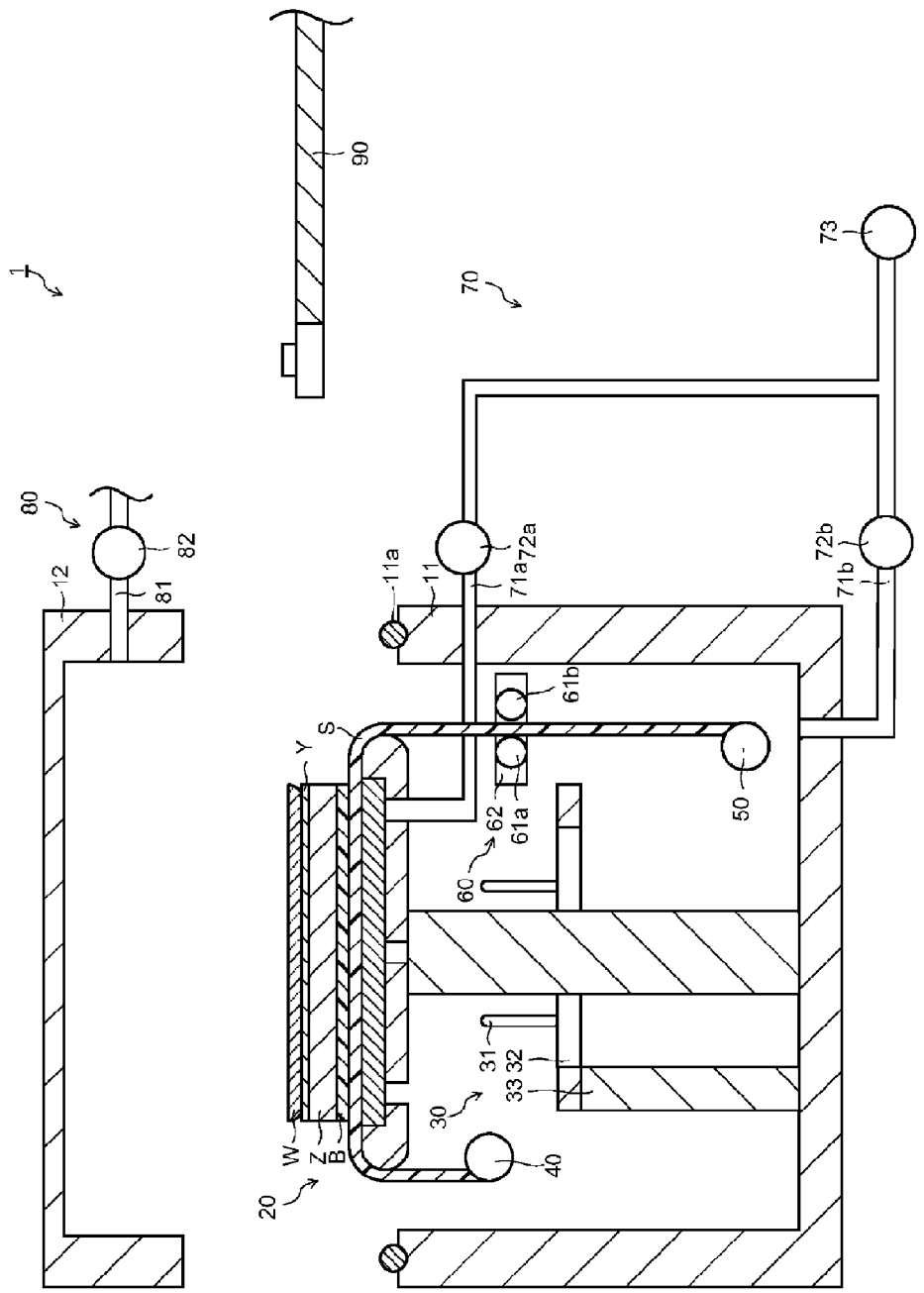
FIG. 6 is a cross-sectional view showing an operation of the semiconductor production apparatus according to the first embodiment.
Figure 7:
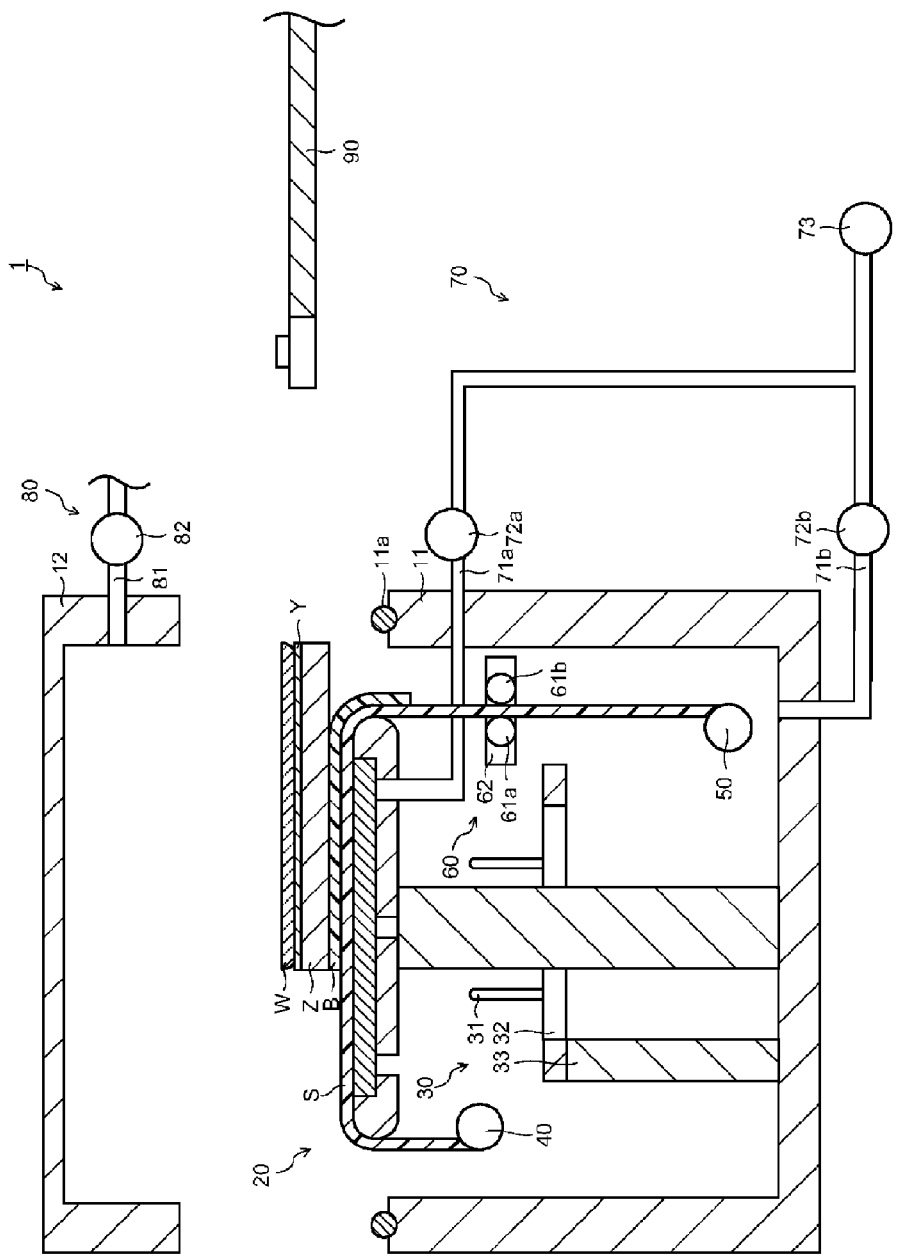
FIG. 7 is a cross-sectional view showing an operation of the semiconductor production apparatus according to the first embodiment.
Figure 8:
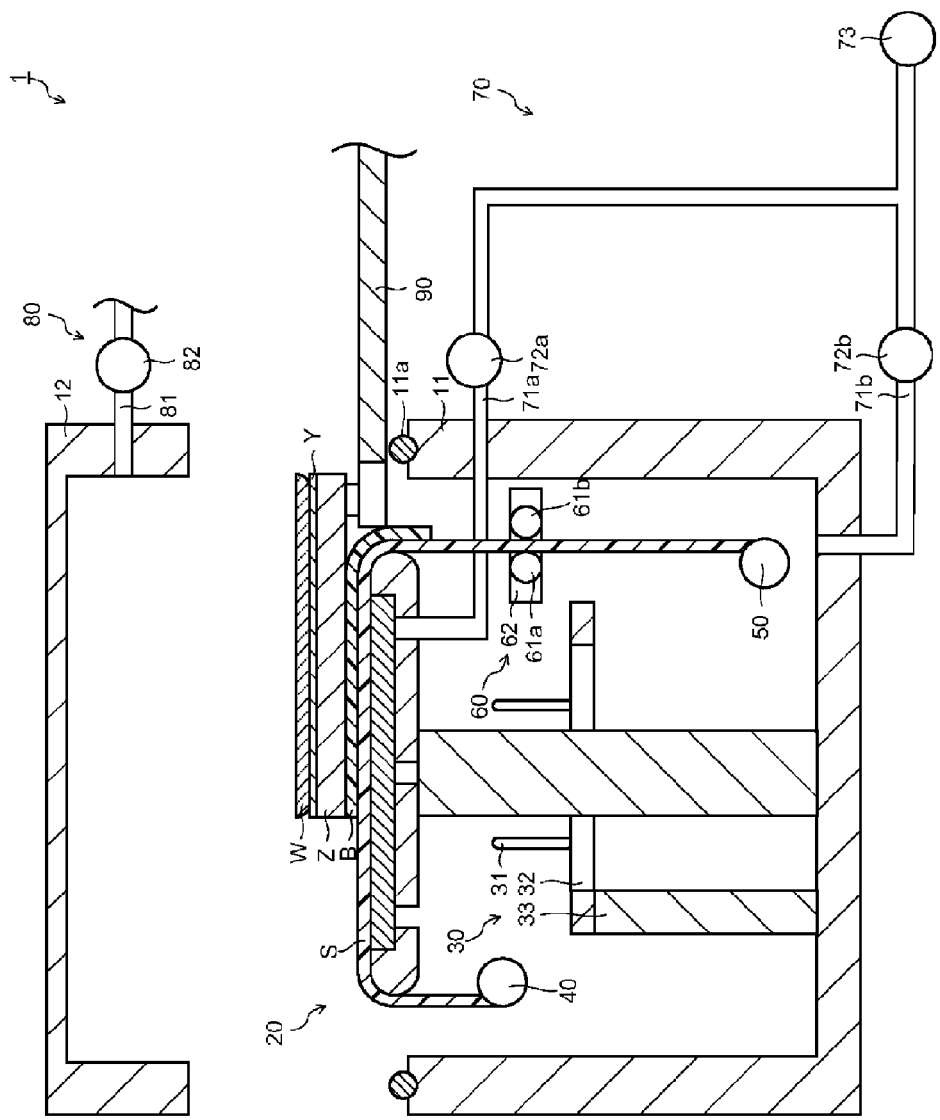
FIG. 8 is a cross-sectional view showing an operation of the semiconductor production apparatus according to the first embodiment.

FIG. 1 is a plan view showing a configuration of a semiconductor production apparatus 1 according to a first embodiment. FIG. 2 is a cross-sectional view showing the configuration of the semiconductor production apparatus 1, which is taken along the line X-X of FIG. 1. As shown in FIGS. 1 and 2, the semiconductor production apparatus 1 includes a chamber 10, an absorption stage 20, a lift unit 30, a feed reel 40, a wind-up reel 50, a peeling unit 60, a vacuum unit 70, an air supply unit 80, and a handler 90.

The chamber 10 includes a chamber main body 11 and a lid 12. The chamber main body 11 includes an O-ring 11a for hermetically sealing between the chamber main body 11 and the lid 12. A semiconductor substrate W (hereinafter, referred to as wafer W) is conveyed to the absorption stage 20 housed in the chamber main body 11 in a state in which the lid 12 is opened. Note that the lid 12 is omitted in FIG. 1.

The absorption stage 20 includes a porous absorption unit 21 and a frame 22. The porous absorption unit 21 is formed by sintering and molding metal or ceramic particles. The frame 22 fixes the absorption unit 21. The absorption unit 21 has a diameter almost the same as a diameter of the wafer W. The absorption unit 21 is connected to the vacuum unit 70 outside the chamber 10. Further, the absorption stage 20 has a plurality of (three in this embodiment) through-holes 20a. Lift pins 31 of the lift unit 30 pass through the through-holes 20a.

The lift unit 30 includes the plurality of (three in the embodiment) lift pins 31, a ring-like retaining plate 32, and a drive unit 33. The plurality of lift pins 31 are mounted on the retaining plate 32. The drive unit 33 drives the retaining plate 32 to move upwards and downwards. An actuator, for example, is used as the drive unit 33. Note that, in order to increase the degree of vacuum of the chamber 10, the drive unit 33 may be provided outside the chamber 10, for example, on a bottom surface of the chamber 10 and may be coupled to the retaining plate 32 through a bellows.

A BSG tape B is bonded to the wafer W via a supporting substrate Z. The supporting substrate Z is bonded to the wafer W with an adhesive Y. A peeling tape S is fed by the feed reel 40. The peeling tape S serves to peel the BSG tape B from the wafer W. The peeling tape S is wound together with the peeled BSG tape B by the wind-up reel 50. Note that the peeling tape S is set on the feed reel 40 and the wind-up reel 50 such that an adhesive surface of the peeling tape S is oriented upwards, i.e., the adhesive surface is in an opposite side of the absorption stage 20.

The peeling unit 60 includes two rollers 61a, 61b and a drive unit 62. The rollers 61a, 61b rotate while nipping the peeling tape S. The drive unit 62 drives the rollers 61a, 61b in a direction perpendicular to a longitudinal direction of the peeling tape S.

The vacuum unit 70 includes vacuum pipes 71a, 71b, valves 72a, 72b, and a vacuum pump 73. The vacuum pipes 71a, 71b are connected to the chamber main body 11. The valves 72a, 72b are provided in the middle of the vacuum pipes 71a, 71b, respectively. The vacuum pump 73 exhausts gas within the chamber 10 formed by the chamber main body 11 and the lid 12. The valves 72a, 72b are opened and closed by clean dry air or $N_2$ gas supplied from an outside. The valves 72a, 72b used in the embodiment are normally close. Alternatively, normally open valves may be used as the valves 72a, 72b.

The air supply unit 80 includes a pipe 81 and a valve 82. The pipe 81 has one end connected to the chamber main body 11 and the other end connected to a clean-dry-air supply source (not shown). The valve 82 is provided in the middle of the pipe 81. The valve 82 is opened and closed by clean dry air or $N_2$ gas supplied from the outside. When the valve 82 is opened, clean dry air is supplied into the chamber 10 and the pressure of the chamber 10 is increased to near atmospheric pressure. The valve 82 used in the embodiment is normally close. However, a normally open valve may be used as the valve 82.

The handler 90 loads, into the chamber 10, the wafer W to which the supporting substrate Z and the BSG tape B are bonded. At that time, the wafer W is placed on the absorption unit 21 of the absorption stage 20 such that the BSG tape B is oriented downwards, i.e., the BSG tape B is oriented to the absorption stage 20. Further, the handler 90 removes, from the absorption stage 20, the wafer W from which the BSG tape B is peeled. The handler 90 unloads the wafer W outside the chamber 10. Note that various handlers may be used as the handler 90. The various handlers include one that retains a wafer by absorption and one that retains a wafer utilizing Bernoulli's principle, for example.

(Operations of Semiconductor Production Apparatus 1)

FIGS. 3 to 9 are cross-sectional views showing operations of the semiconductor production apparatus 1. Hereinafter, referring to FIGS. 3 to 9, the operations of the semiconductor production apparatus 1 to peel the BSG tape B will be described. It is assumed that the peeling tape S has been already set on the feed reel 40 and the wind-up reel 50.

First, the lid 12 of the chamber 10 is opened. Subsequently, the handler 90 conveys the wafer W with the supporting substrate Z and the BSG tape B being bonded to a main surface of the wafer W, to a predetermined position above the absorption stage 20 (see FIG. 3).

The drive unit 33 causes the lift pins 31 to move upwards. Then, the wafer W is passed from the handler 90 to the lift pins 31. Subsequently, the handler 90 is retracted outside the chamber 10. The drive unit 33 causes the lift pins 31 to move downwards. Then, the wafer W is placed on the absorption unit 21 of the absorption stage 20 and on the peeling tape S such that a side of the wafer W on which the BSG tape B is bonded is oriented downwards, i.e., the side of the wafer W on which the BSG tape B is bonded is oriented to the absorption stage 20 (see FIG. 4).

The valve 72a of the vacuum unit 70 is supplied with clean dry air or $N_2$ gas to open the valve 72a. As a result, the porous absorption unit 21 absorbs the wafer W. Thus, the BSG tape B is brought into close contact with the adhesive surface of the peeling tape S. Subsequently, the supply of clean dry air or $N_2$ gas to the valve 72a is stopped and the lid 12 of the chamber 10 is closed (see FIG. 5).

After that, the valve 72b of the vacuum unit 70 is supplied with clean dry air or $N_2$ gas to open the valve 72b. The pressure of the chamber 10 is reduced to near 200 Pa. Thus, the BSG tape B and the peeling tape S are bonded to each other by deaeration. The bonding by deaeration increases the adhesion between the BSG tape B and the peeling tape S. Accordingly, adhesion force required to peel the BSG tape B bonded to the wafer W via the supporting substrate Z is ensured.

After a predetermined period of time, for example, several seconds to several tens of seconds have elapsed, the supply of clean dry air or $N_2$ gas to the valve 72b is stopped. The valve 82 of the air supply system 80 is opened. The chamber 10 is supplied with clean dry air. The pressure of the chamber 10 is increased to near atmospheric pressure. After that, the lid 12 of the chamber 10 is opened (see FIG. 6).

Subsequently, the drive unit 62 of the peeling unit 60 drives the rollers 61a, 61b to nip the peeling tape S. Then, the rollers 61a, 61b rotate and draw the peeling tape S to a lower side of the absorption stage 20. In such a manner, the BSG tape B bonded to the wafer W via the supporting substrate Z is peeled (see FIG. 7).

When the BSG tape B is peeled, the wafer W moves along a moving direction of the peeling tape S with the peeling of the BSG tape B. In other words, the wafer W moves to the right in the figure. Therefore, when the BSG tape B is peeled by approximately one third of the area of the wafer W, for example, the handler 90 absorbs the supporting substrate Z bonded to the wafer W, to thereby support the wafer W (see FIG. 8).

Figure 9:
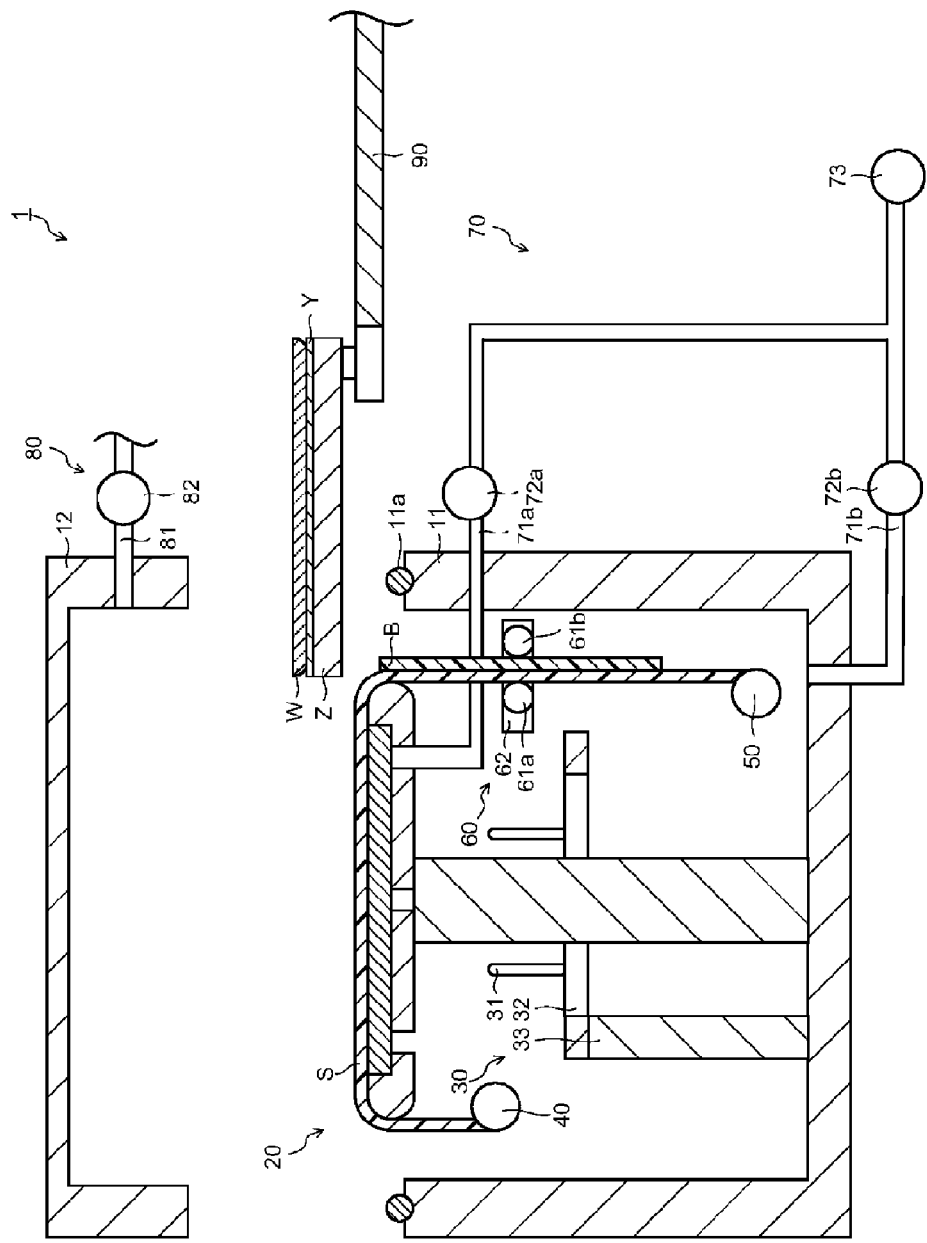
FIG. 9 is a cross-sectional view showing an operation of the semiconductor production apparatus according to the first embodiment.

Subsequently, the peeling tape S is drawn and the handler 90 is moved to the right in the figure corresponding to the amount of drawing of the peeling tape until the BSG tape B is completely peeled off (see FIG. 9). Note that the peeled BSG tape B is wound together with the peeling tape S by the wind-up reel 50.

As described above, in the semiconductor production apparatus 1 according to the first embodiment, the wafer W to which the BSG tape B is bonded via the supporting substrate Z is placed on the absorption stage 20 on which the peeling tape S is placed such that the adhesive surface is oriented upwards. At that time, the wafer W is placed such that the BSG tape is oriented downwards. Then, the BSG tape B is peeled by drawing the peeling tape S toward the lower side of the absorption stage 20 in a state in which the peeling tape S is bonded to the BSG tape B.

Therefore, in the semiconductor production apparatus 1, the BSG tape B is peeled off without touching a back surface of the wafer W. Thus, it cannot be generated that particles (dust) or contaminants such as organic matters and metals adhere to the back surface of the wafer W or the wafer W is damaged due to mechanical contact. Consequently, it is possible to effectively prevent problems due to adhesion of particles and contaminants to the back surface of the wafer W.

The problems include that electrodes on the back surface are detached, defects occur during resist coating or light exposure, impurity ions are not implanted in some areas, a conductive type of a channel of a semiconductor device is reversed, and a carrier lifetime of an electric charge is below a standard value, for example. Further, no mechanical contact with the wafer W occurs, and hence it is possible to effectively prevent a break or crack from occurring in the wafer W.

Moreover, the pressure of the chamber 10 is reduced to perform the bonding by deaeration, which increases the adhesion between the BSG tape B and the peeling tape S. Thus, it becomes easy to ensure the adhesion force required to peel the BSG tape B bonded to the wafer W via the supporting substrate Z. In the first embodiment, the peeling unit 60 is used to peel the BSG tape B from the supporting substrate Z. However, the peeling tape S may be wound by the wind-up reel 50 to peel the BSG tape B from the supporting substrate Z. In such a case, the peeling unit 60 can be omitted.

(Second Embodiment)

Figure 10:
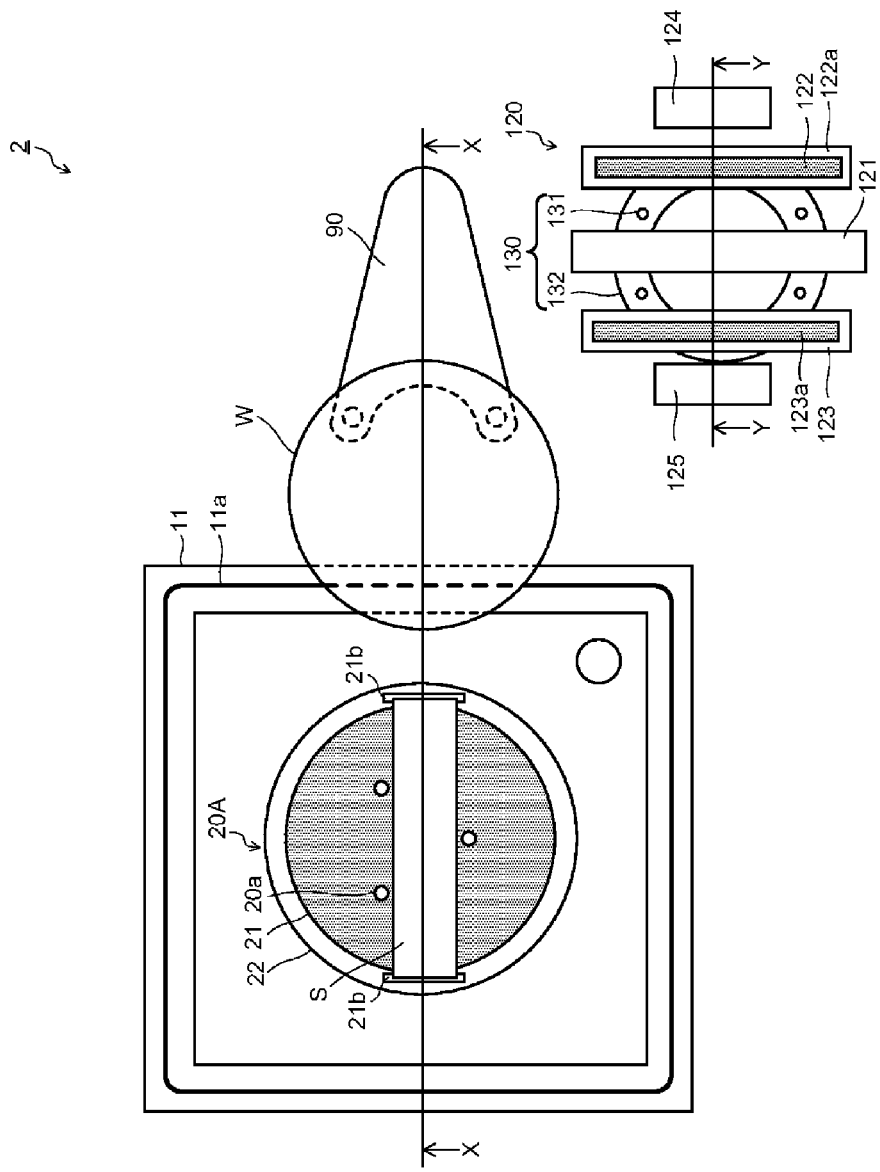
FIG. 10 is a plan view showing a configuration of a semiconductor production apparatus according to a second embodiment.
Figure 11:
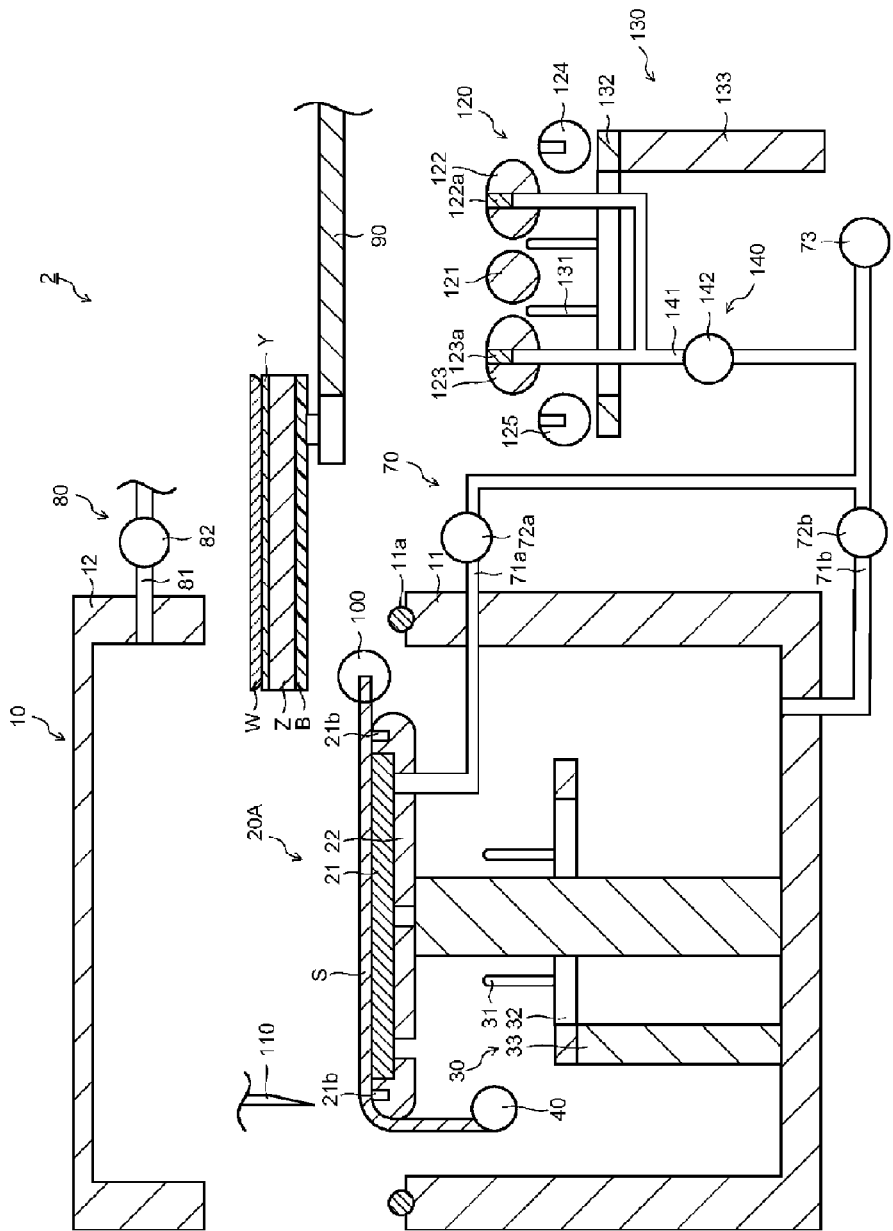
FIG. 11 is a cross-sectional view showing the configuration of the semiconductor production apparatus according to the second embodiment.
Figure 12:
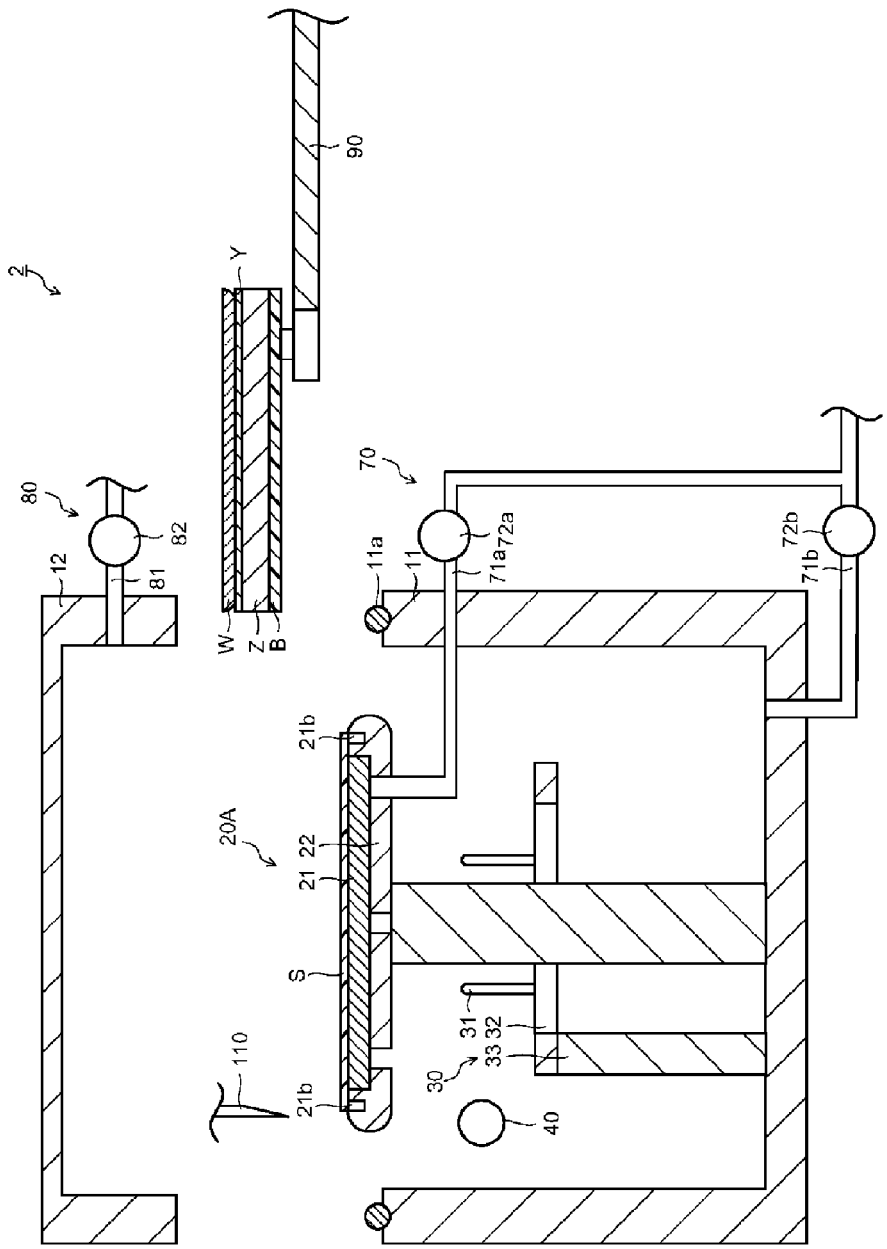
FIG. 12 is a cross-sectional view showing an operation of the semiconductor production apparatus according to the second embodiment.
Figure 13:
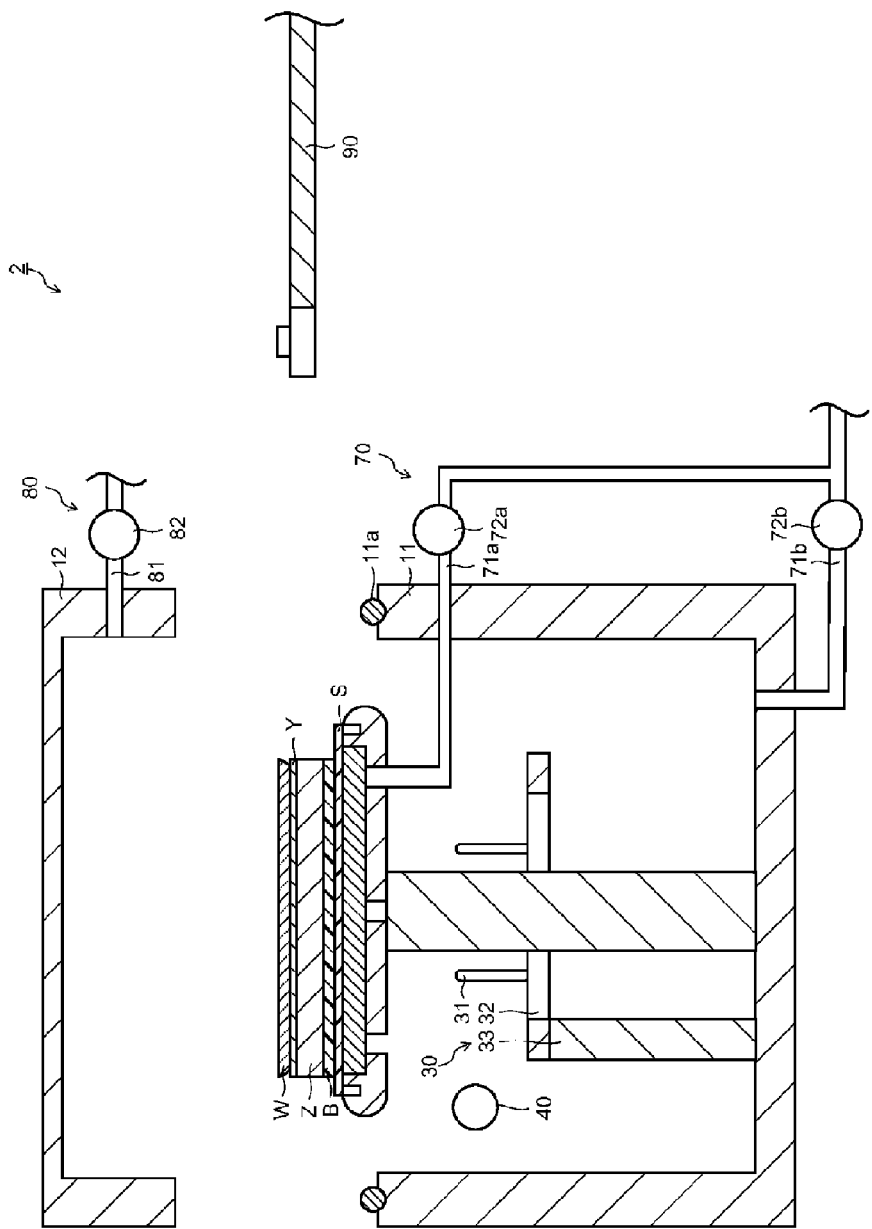
FIG. 13 is a cross-sectional view showing an operation of the semiconductor production apparatus according to the second embodiment.
Figure 14:
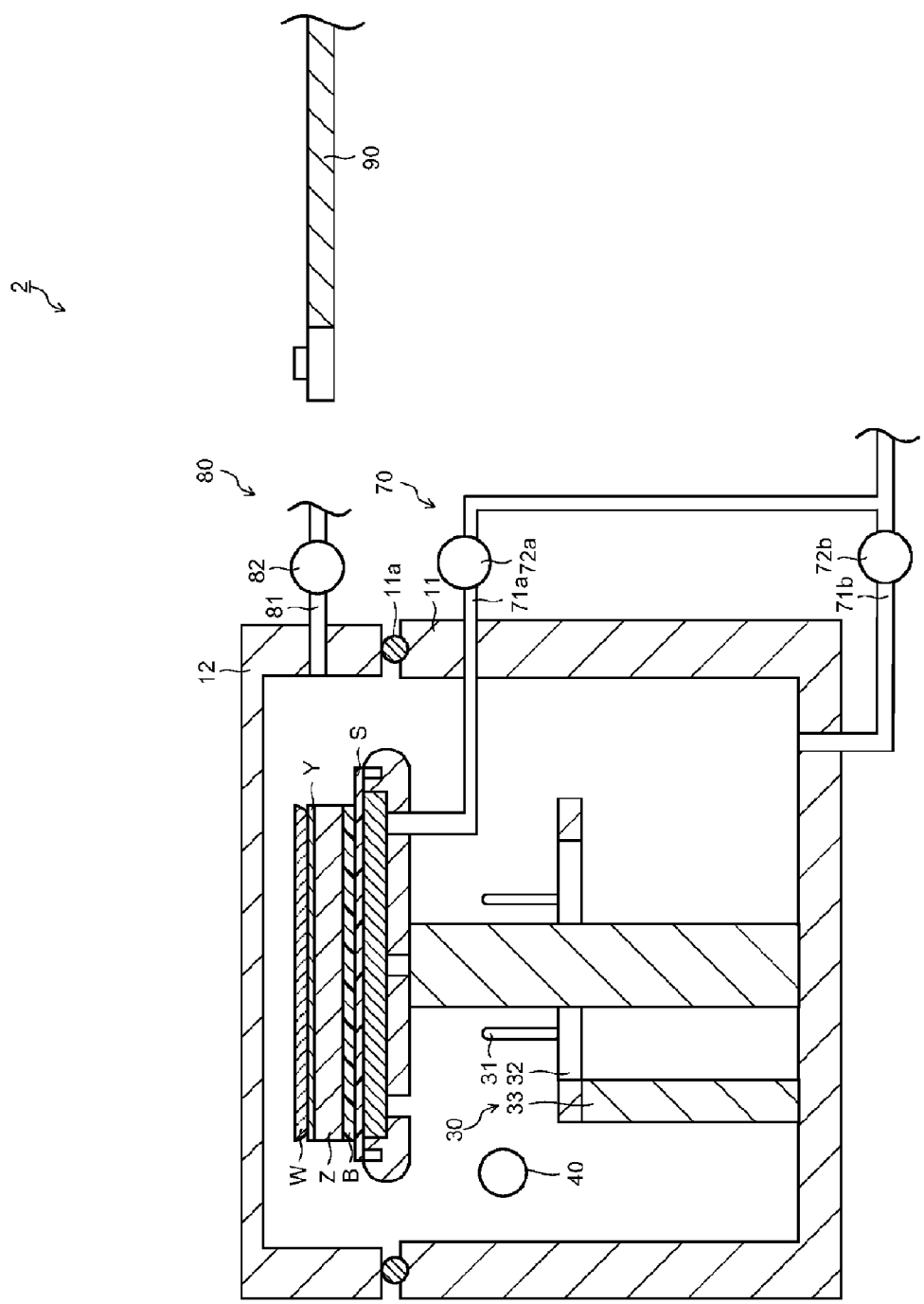
FIG. 14 is a cross-sectional view showing an operation of the semiconductor production apparatus according to the second embodiment.
Figure 15:
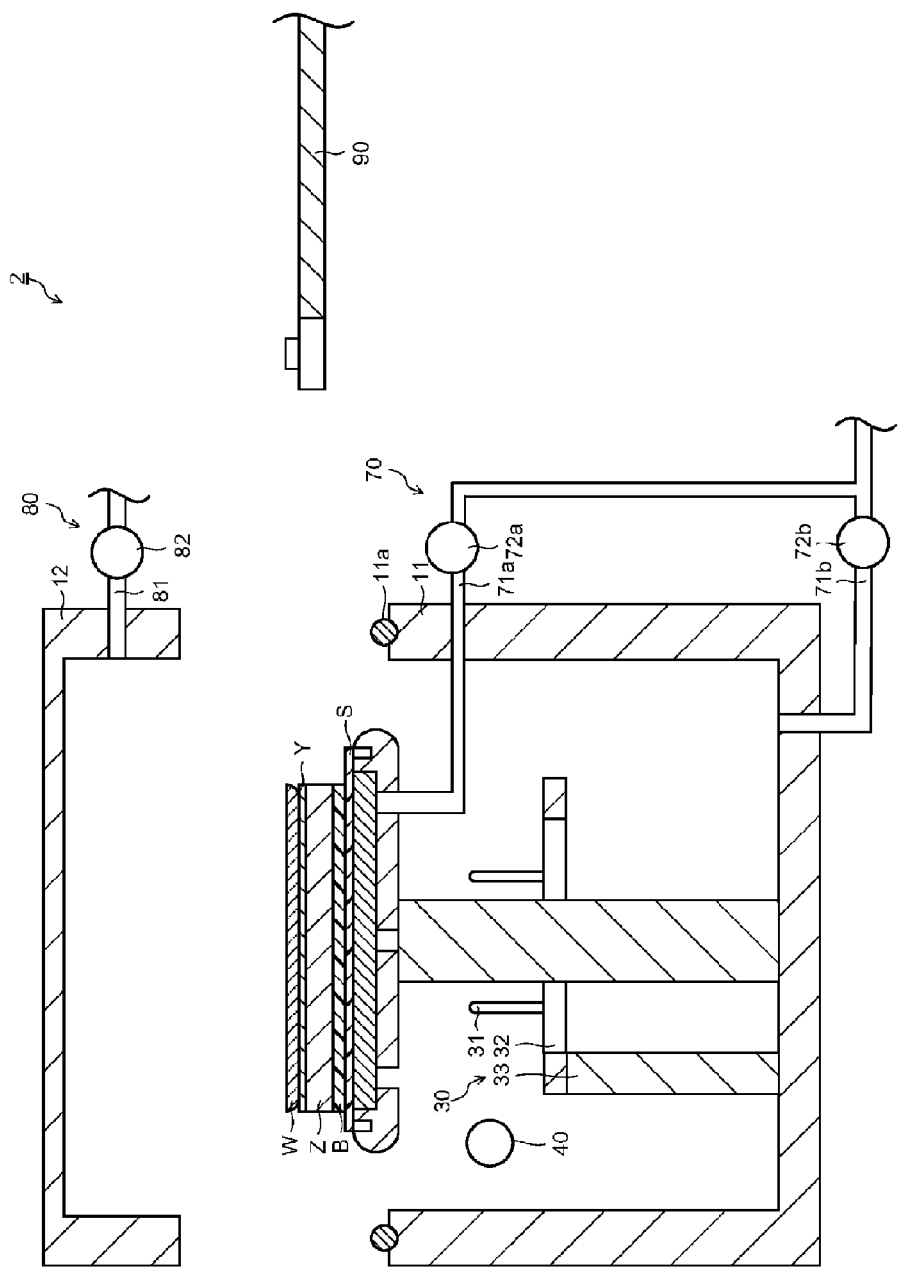
FIG. 15 is a cross-sectional view showing an operation of the semiconductor production apparatus according to the second embodiment.

FIG. 10 is a plan view showing a configuration of a semiconductor production apparatus 2 according to a second embodiment. FIG. 11 is a cross-sectional view showing the configuration of the semiconductor production apparatus 2, which is taken along the lines X-X and Y-Y of FIG. 10. Hereinafter, referring to FIGS. 10 and 11, the configuration of the semiconductor production apparatus 2 will be described. The same components as those of the semiconductor production apparatus 1 described above with reference to FIGS. 1 and 2 will be denoted by the same reference symbols and duplicate description will be omitted.

As shown in FIGS. 10 and 11, the semiconductor production apparatus 2 includes a chamber 10, an absorption stage 20A, a lift unit 30, a feed reel 40, a vacuum unit 70, an air supply unit 80, a handler 90, a draw-out unit 100, a cutter 110, a peeling unit 120, a lift unit 130, and a vacuum unit 140.

The draw-out unit 100 draws a peeling tape S out of the feed reel 40 and places the peeling tape S on the absorption stage 20A such that an adhesive surface of the peeling tape S is oriented upwards, i.e., the adhesive surface is in an opposite side of the absorption stage 20A.

The cutter 110 cuts the peeling tape S placed on the absorption stage 20A. The cutter 110 cuts the peeling tape S to have a length larger than a diameter of a wafer W in order that the peeling tape S has a margin for processing in the peeling unit 120.

The absorption stage 20A has a groove 21b. The groove 21b is formed to prevent a contact of the cutter 110 with the absorption stage 20A when the cutter 110 cuts the peeling tape S. Other components are the same as the components of the absorption stage 20 of the semiconductor production apparatus 1 described above with reference to FIGS. 1 and 2, and hence duplicate description will be omitted.

The peeling unit 120 is provided outside the chamber 10. The peeling unit 120 includes a fixation unit 121, first and second movable units 122, 123, and drawn-in units 124, 125. The fixation unit 121 extends in a direction almost orthogonal to a longitudinal direction of the peeling tape S. The first and second movable units 122, 123 are arranged while sandwiching the fixation unit 121. The first and second movable units 122, 123 are configured to be movable toward a lower side of the fixation unit 121. Further, the movable units 122, 123 include porous absorption units 122a, 123a, respectively. The absorption units 122a, 123a are formed by sintering and molding metal or ceramic particles. The absorption units 122a, 123a of the movable units 122, 123 are connected to the vacuum unit 140 so as to absorb a BSG tape B of the wafer W. The drawn-in units 124, 125 grasp both ends of the peeling tape S and draw the peeling tape S toward a lower side of the first and second movable units 122, 123, to thereby peel the BSG tape B.

The lift unit 130 includes a plurality of (four in this embodiment) lift pins 131, a ring-like retaining plate 132, and a drive unit 133 (e.g., actuator). The plurality of lift pins 131 are mounted on the retaining plate 132. The drive unit 133 drives the retaining plate 132 to move upwards and downwards.

The vacuum unit 140 includes a vacuum pipe 141 and a valve 142. The vacuum pipe 141 is connected to the absorption units 122a, 123a of the movable units 122, 123. The valve 142 is provided in the middle of the vacuum pipe 141. The vacuum pipe 141 is connected to a vacuum pump 73 of the vacuum unit 70. The valve 142 is opened and closed by clean dry air or $N_2$ gas supplied from an outside. The valve 142 used in the embodiment is normally close. However, a normally open valve may be used as the valve 142.

(Operations of Semiconductor Production Apparatus 2)

FIGS. 12 to 20 are cross-sectional views showing operations of the semiconductor production apparatus 2. Hereinafter, referring to FIGS. 12 to 20, the operations of the semiconductor production apparatus 2 to peel off the BSG tape B will be described.

First, a lid 12 of the chamber 10 is opened. Subsequently, the draw-out unit 100 draws the peeling tape S out of the feed reel 40 and places the peeling tape S on the absorption stage 20A such that the adhesive surface is oriented upwards, i.e., the adhesive surface is in the opposite side of the absorption stage 20A. Subsequently, the cutter 110 cuts the peeling tape S in a state in which an absorption unit 21 of the absorption stage 20A absorbs the peeling tape S (see FIG. 12).

Subsequently, the handler 90 conveys the wafer W with a supporting substrate Z and the BSG tape B being bonded to a main surface of the wafer W, to a predetermined position above the absorption stage 20A.

The drive unit 33 causes the lift pins 31 to move upwards. Then, the wafer W is passed from the handler 90 to the lift pins 31. Subsequently, the handler 90 is retracted outside the chamber 10. The drive unit 33 causes the lift pins 31 to move downwards. Then, the wafer W is placed on the absorption unit 21 of the absorption stage 20A and on the peeling tape S placed on the absorption stage 20A such that the adhesive surface is oriented upwards. At that time, the wafer W is placed such that a side of the wafer W on which the BSG tape B is bonded, is oriented downwards, i.e., the side of the wafer W on which the BSG tape B is bonded, is oriented to the absorption stage 20A (see FIG. 13).

A valve 72a of the vacuum unit 70 is supplied with clean dry air or $N_2$ gas to open the valve 72a. As a result, the porous absorption unit 21 absorbs the wafer W. Thus, the BSG tape B is brought into close contact with the adhesive surface of the peeling tape S.

Subsequently, the supply of clean dry air or $N_2$ gas to the valve 72a is stopped. The lid 12 of the chamber 10 is closed (see FIG. 14). After that, a valve 72b of the vacuum unit 70 is supplied with clean dry air or $N_2$ gas to open the valve 72b. The pressure of the chamber 10 is reduced to near 200 Pa. Thus, the BSG tape B and the peeling tape S are bonded to each other by deaeration. The bonding by deaeration increases the adhesion between the BSG tape B and the peeling tape S. Accordingly, adhesion force required to peel the BSG tape B bonded to the wafer W via the supporting substrate Z is ensured.

After a predetermined period of time, for example, several seconds to several tens of seconds have elapsed, the supply of clean dry air or $N_2$ gas to the valve 72b is stopped. A valve 82 of an air supply unit 80 is opened. The chamber 10 is supplied with clean dry air. Thus, the pressure of the chamber 10 is increased to near atmospheric pressure. After that, the lid 12 of the chamber 10 is opened (see FIG. 15).

The drive unit 33 causes the lift pins 31 to move upwards. Thus, the lift pins 31 lift the wafer W to which the peeling tape S is bonded. Subsequently, the handler 90 absorbs the BSG tape B bonded to a lower surface of the wafer W via the supporting substrate Z, to thereby retain the wafer W. The drive unit 33 causes the lift pins 31 to move downwards. Then, the wafer W is passed from the lift pins 31 to the handler 90.

Figure 16:
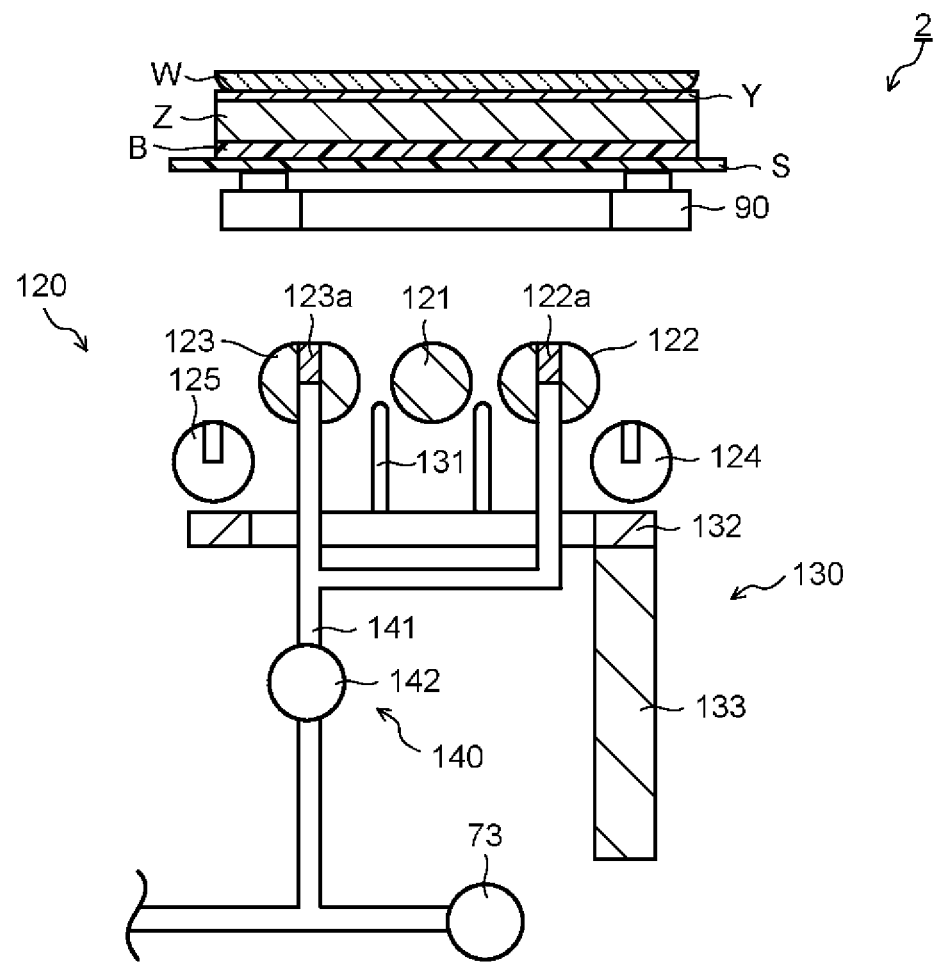
FIG. 16 is a cross-sectional view showing an operation of the semiconductor production apparatus according to the second embodiment.
Figure 17:
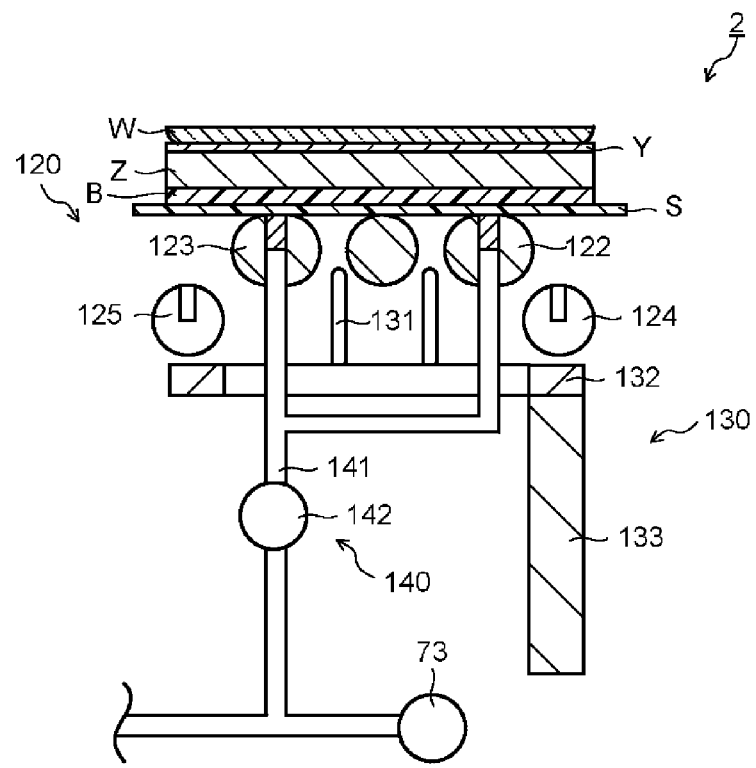
FIG. 17 is a cross-sectional view showing an operation of the semiconductor production apparatus according to the second embodiment.
Figure 18:
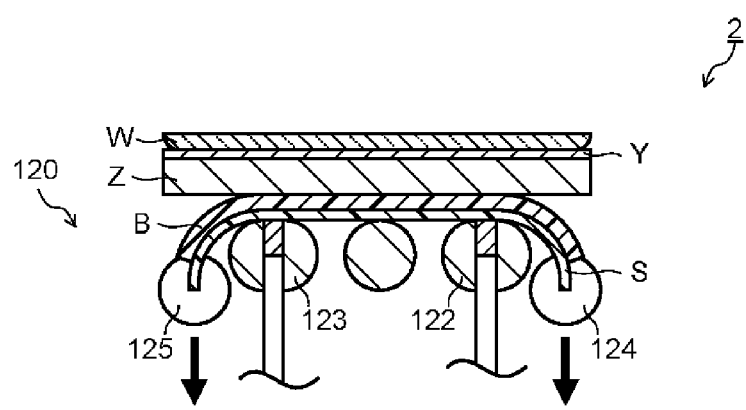
FIG. 18 is a cross-sectional view showing an operation of the semiconductor production apparatus according to the second embodiment.
Figure 19:
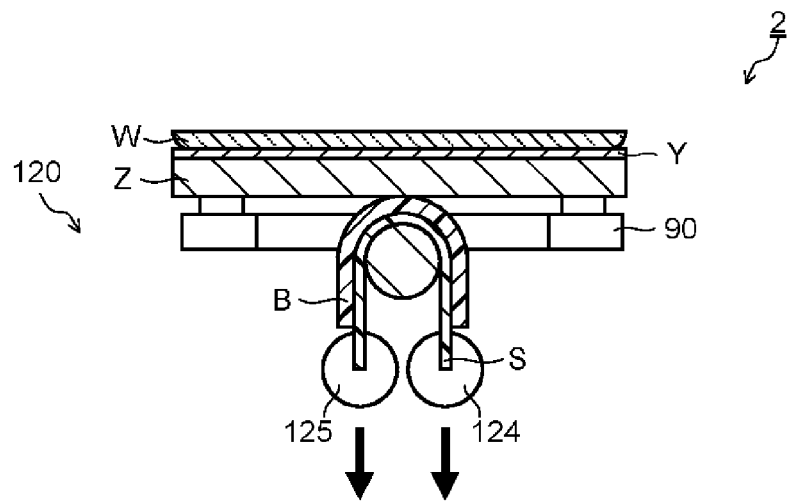
FIG. 19 is a cross-sectional view showing an operation of the semiconductor production apparatus according to the second embodiment.

Subsequently, the handler 90 conveys the wafer W to a predetermined position above the peeling unit 120 (see FIG. 16). At that time, the first and second movable units 122, 123 are positioned such that the first and second movable units 122, 123 sandwich the fixation unit 121 and an upper end surface of the fixation unit 121 is located at the same height level as upper end surfaces of the first and second movable units 122, 123. Subsequently, the drive unit 133 causes the lift pins 131 to move upwards. Then, the wafer W is passed from the handler 90 to the lift pins 131.

After the handler 90 is retracted, the drive unit 133 causes the lift pins 131 to move downwards and places the wafer W on the fixation unit 121 and the first and second movable units 122, 123 of the peeling unit 120. At that time, the wafer W is placed such that the side of the wafer W on which the BSG tape B is bonded, is oriented downwards, i.e., the side of the wafer W on which the BSG tape B is bonded is oriented to the fixation unit 121 and the first and second movable units 122, 123 of the peeling unit 120 (see FIG. 17).

Subsequently, the valve 142 of the vacuum unit 140 is supplied with clean dry air or $N_2$ gas to open the valve 142. The BSG tape B bonded to the wafer W via the supporting substrate Z are absorbed by the absorption units 122a, 123a of the first and second movable units 122, 123. Subsequently, the drawn-in units 124, 125 grasp the both ends of the peeling tape S and draw the peeling tape S toward the lower side of the first and second movable units 122, 123, to thereby partially peel the BSG tape B (see FIG. 18).

Subsequently, the handler 90 absorbs an area of the supporting substrate Z in which the BSG tape B is peeled, to thereby support the supporting substrate Z. Then, the supply of the clean dry air or $N_2$ gas to the valve 142 of the vacuum unit 140 is stopped. The valve 142 is closed. The first and second movable units 122, 123 are retracted to a lower side of the fixation unit 121. Subsequently, the drawn-in units 124, 125 further peel the peeling tape S toward the lower side of the fixation unit 121 (see FIG. 19).

Figure 20:
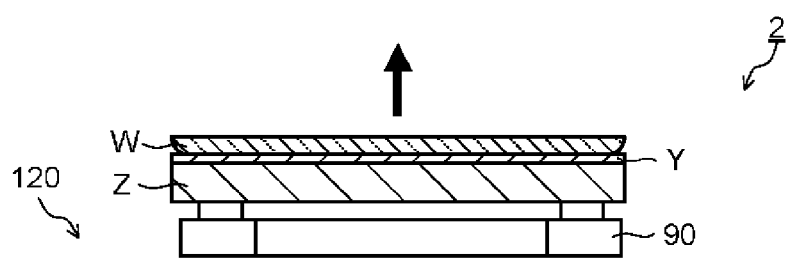
FIG. 20 is a cross-sectional view showing an operation of the semiconductor production apparatus according to the second embodiment.
Figure 20:
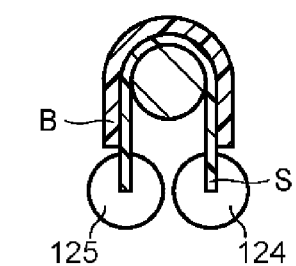

Subsequently, the handler 90 is moved upwards to completely peel off the BSG tape B (see FIG. 20).

As described above, the semiconductor production apparatus 2 according to the second embodiment can peel off the BSG tape B without touching a back surface of the wafer W. Note that the semiconductor production apparatus 2 according to the second embodiment gives the same effects as those of the semiconductor production apparatus 1 according to the first embodiment, and hence duplicate description will be omitted.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor production apparatus, comprising:
   a supporting substrate having an upper surface to which a semiconductor substrate is bonded, and a lower surface to which a back side grinding (BSG) tape is bonded;
   a stage having an upper surface on which a peeling tape is positioned, such that an adhesive surface of the peeling tape is oriented upwards;
   a handler which transfers the supporting substrate to the stage in a state such that the BSG tape bonded to the lower surface of the supporting substrate is oriented downwards toward the stage and positioned onto the peeling tape; and
   a peeling unit which draws the peeling tape to peel the BSG tape from the lower surface of the supporting substrate.

2. The apparatus of claim 1, further comprising:
   a chamber housing the stage and the handler; and
   a vacuum unit which is connected to the chamber and which reduces pressure in the chamber.

3. The apparatus of claim 2, wherein the stage comprises a porous-like absorption material and a frame on which the absorption material is provided, and wherein the stage is connected to the vacuum unit.

4. The apparatus of claim 1, further comprising:
   a first reel which serves the peeling tape; and
   a second reel which receives and winds up the peeling tape;
   wherein the first reel is positioned on a first side of the stage, and the second reel is positioned on a second side of the stage opposite to the first side of the stage;
   wherein the peeling unit, the first reel and the second reel are installed in the chamber; and
   wherein the peeling unit comprises a first roller, a second roller and a drive unit to draw the peeling tape from the first reel along the stage by nipping the peeling tape with the first roller and the second roller and feeding the peeling tape to the second reel by the drive unit.

5. The apparatus of claim 1, further comprising:
   a reel which is arranged on a lower side of the stage and which serves the peeling tape;
   a cutter which is arranged on an upper side of the stage above the reel and which cuts the peeling tape; and
   a draw-out unit which draws out the peeling tape via the stage;
   wherein the reel is positioned on a first side of the stage, and the draw out unit is positioned on a second side of the stage opposite to the first side of the stage.

6. The apparatus of claim 1, wherein:
   the peeling unit includes a first movable unit, a second movable unit, a fixation unit, and a draw-in unit; and
   the fixation unit extends in a direction approximately perpendicular to a longitudinal direction of the peeling tape, the first movable unit and the second movable unit sandwich the fixation unit and are movable to a lower side of the fixation unit, and the draw-in unit clamps and draws the peeling tape when the peeling tape is contacted to at least one of the fixation unit and both the first movable unit and the second movable unit.

7. The apparatus of claim 6, wherein the peeling unit is positioned outside the chamber and is connected to a vacuum unit.

8. The apparatus of claim 7, further comprising:
   a lift unit which is positioned on a lower side of the peeling unit, and which comprises a plurality of lift pins mounted on a ring-like retaining plate and a drive unit;
   wherein the drive unit moves the semiconductor substrate, onto which the BSG tape is bonded, upwards and downwards via the plurality of lift pins mounted on the ring-like retaining plate.

\* \* \* \* \*